United States Patent [19]

Feng

[11] 4,022,932
[45] May 10, 1977

[54] RESIST REFLOW METHOD FOR MAKING SUBMICRON PATTERNED RESIST MASKS

[75] Inventor: Bai Cwo Feng, Wappingers Falls, N.Y.

[73] Assignee: International Business Machines Corporation, Armonk, N.Y.

[22] Filed: June 9, 1975

[21] Appl. No.: 584,789

[52] U.S. Cl. .................. 427/93; 427/43; 427/44; 427/82; 427/96; 427/259; 427/273; 427/335; 427/336; 96/36; 96/36.2

[51] Int. Cl.² ............... B05D 3/04; B05D 3/12

[58] Field of Search ........... 427/273, 335, 336, 93, 427/82, 259, 43, 44, 96, 96.2; 96/36, 36.2

[56] References Cited

UNITED STATES PATENTS

| 243,200 | 6/1881 | Bradley | 427/273 |
|---|---|---|---|
| 2,138,578 | 11/1938 | Hershberger | 427/335 |
| 2,294,479 | 9/1942 | Peter | 427/335 |
| 3,339,526 | 9/1967 | Bradley | 427/335 |
| 3,539,381 | 11/1970 | Kayarian | 427/335 |
| 3,597,257 | 8/1971 | Dunn | 427/335 |
| 3,737,499 | 6/1973 | Kaming | 427/335 |

OTHER PUBLICATIONS

Galindo et al., IBM TDB, vol, 13, No. 5, (10–1970), p. 1266, Method of Photoresist Appl.
Esch et al., IBM TDB, vol. 16, No. 6, (11–1973), Rheology...by Spin, pp. 1730–1731.

*Primary Examiner*—Michael F. Esposito
*Attorney, Agent, or Firm*—Robert J. Haase

[57] ABSTRACT

The method for making patterned resist masks having minimum opening dimensions. The mask is prepared initially using standard photo or electron beam lithography techniques to yield the smallest aperture dimensions consistent with the state-of-the-art. Then, the resulting mask is placed within a chamber containing an atmosphere of resist solvent vapor. The vapor is absorbed by the patterned resist mask causing controlled resist reflow which uniformly reduces the dimensions of the resist openings by an amount determined by time, temperature, resist thickness, resist type and solvent used.

7 Claims, 5 Drawing Figures

RESIST REFLOW METHOD FOR MAKING SUBMICRON PATTERNED RESIST MASKS

BACKGROUND OF THE INVENTION

1. Field of the Invention

The present invention generally relates to methods for making patterned masks of resist material and, more particularly, to a controlled resist reflow process for reducing resist aperture dimensions.

2. Description of the Prior Art

One of the major factors, i.e., device size, governing integrated semiconductor device speed and performance is determined by the dimensions of the openings in patterned resist masks used in etching and diffusion processes. Because of inherent characteristics such as, for example, reduced capacitance smaller sized devices generally exhibit superior performance and facilitate the design of high density integrated circuits. Efforts toward making smaller sized devices are confronted with the ultimate resolution with which resist material can be sensitized prior to development of the resist. In the case of photosensitive resist material, there is significant difficulty in achieving line resolutions smaller than 100 micro inches. Electron beam lithography techniques encounter serious difficulties when windows of less than 50 micro inches are desired.

SUMMARY OF THE INVENTION

The line width limitations of state-of-the-art photo or electron beam lithographic techniques for patterning resist materials are substantially reduced in accordance with the method of the present invention by placing the patterned resist structure within a chamber containing an atmosphere of resist solvent vapor. The vapor is absorbed by the patterned resist material causing volume expansion and viscosity reduction of the resist material with consequent resist reflow in the window areas. By the proper choice of resist thickness, solvent, temperature, and the time of the solvent treatment the extent of the resist reflow and the consequent resist window size reduction is readily controllable. Each window in the patterned resist circumscribes a planar surface of the underlying structure so that the resist reflow is unrestrained within the window area.

DESCRIPTION OF THE PREFERRED EMBODIMENT

Figure 1:
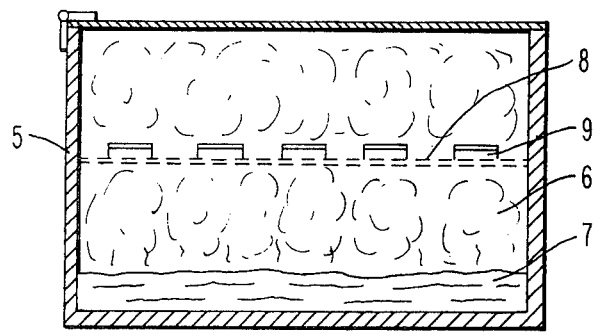
FIG. 1 is a diagrammatic sketch of a solvent vapor chamber for processing patterned resist structures in accordance with the present invention.

Patterned resist masks permitting the fabrication of structures having line width dimensions in the submicron range are achieved in accordance with the present invention by a method whose initial steps follow prior art practice. In the case of the fabrication of integrated semiconductor devices using photoresist masking technology, for example, the semiconductor substrate 1 of FIG. 3A is covered by a silicon dioxide diffusion masking layer 2 and patterned photoresist layer 3. The conventional processing steps yielding the structure of FIG. 3A include the oxidation of substrate 1 to yield layer 2, precleaning of layer 2, application of photoresist layer 3, and the prebake, masking, exposure and development of layer 3 to provide a predetermined pattern of openings therein. The pattern is best shown in the plan view of FIG. 2A and is represented as opening 4 in the cross-sectional view of FIG. 3A. The surface of oxide layer 2 is planar within the area of opening or window 4. As is well understood in the art, oxide layer 2 later is etched away using the apertured layer 3 as a mask. The apertured oxide, in turn, may be used for defining substrate areas into which conductivity determining impurities may be diffused. The dimensions of the diffused areas determine the size of the resulting functional semiconductor devices. The dimensions of opening 4 in resist layer 3 ultimately determine the dimensions of the diffused areas.

Figure 2A:
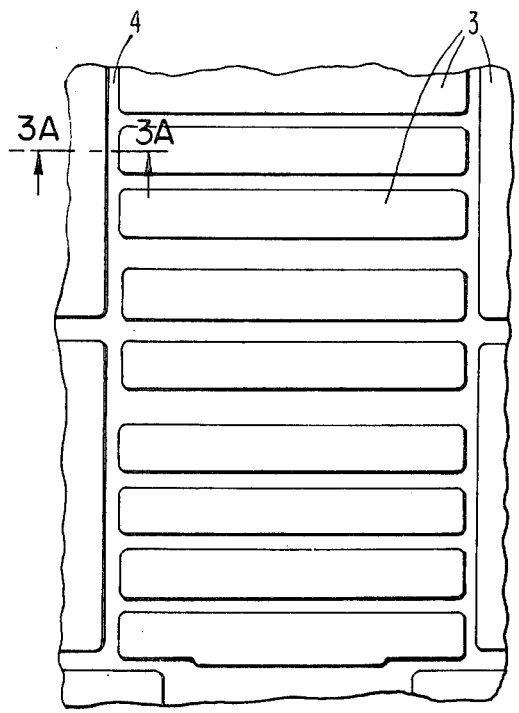
FIG. 2A is a plan view of a prior art patterned resist structure.
Figure 3A:
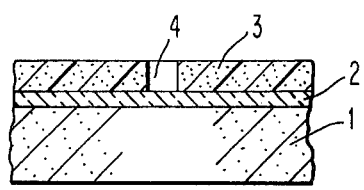
FIG. 3A is a cross-sectional view of the indicated portion of the structure of FIG. 2A.

After the patterned resist structure of FIGS. 2A and 3A is formed in a conventional manner, the structure is placed into chamber 5 of FIG. 1 containing a resist solvent atmosphere 6 produced by a quantity of a suitable solvent material 7 at the bottom of chamber 6. The support screen 8 within chamber 5 distributes the resist solvent vapor uniformly over the upper functional surfaces of patterned resist structures 9 corresponding to the structures of FIGS. 2A and 3A. As the photoresist on the surfaces of devices 9 absorbs the solvent vapor of atmosphere 6, the photoresist begins to flow uniformly into the apertures or windows 4 of photoresist layer 3 as a result of the increase in the volume of the photoresist and the decrease of the viscosity of the photoresist. The reflow of the resist is unrestrained because of the planar configuration of oxide layer 2 within each window such as, window 4 as shown in FIG. 3A. The unrestrained reflow, in turn, facilitates a controlled uniform reduction in the window area in accordance with the reflow process parameter values employed.

A resist reflow technique also is disclosed in copending patent application Ser. No. 480,086, filed June 17, 1974, now U.S. Pat. No. 3,976,524 for Planarization of Integrated Circuit Surfaces Through Selective Photoresist Masking in the name of the present inventor and assigned to the present assignee. In the aforesaid application, however, the magnitude of reflow is not controlled by variation of the process parameters. In that case, the resist is placed inside surrounding elevated areas on a non-planar substrate surface. The walls of the surrounding elevated areas delineate the extent to which the resist is caused to reflow.

Figure 2B:
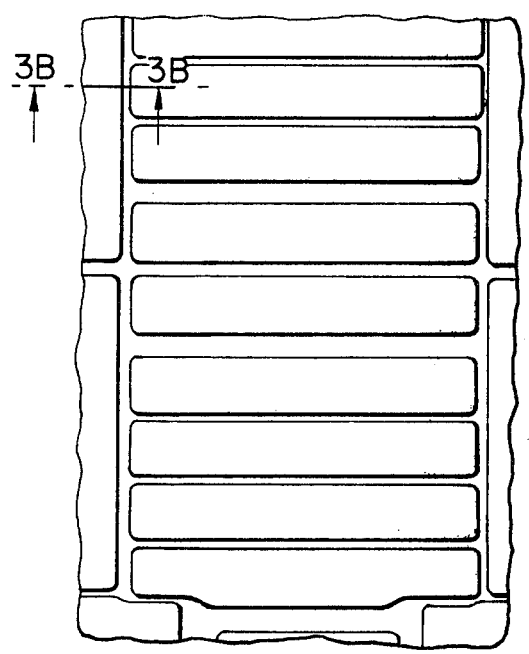
FIG. 2B is a plan view of the structure of FIG. 2A after processing in accordance with the present invention.
Figure 3B:
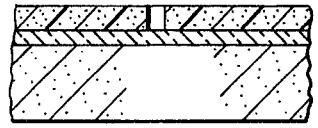
FIG. 3B is a cross-sectional view of the indicated portion of the structure of FIG. 2B.

The manner in which the dimensions of the openings in the patterned resist layer are reduced in accordance with the present invention can be visualized by comparing FIGS. 2A and 2B and by comparing FIGS. 3A and 3B. The prior art pattern shown in the plan view of FIG. 2A is that of a resist mask used in the formation of isolation regions in the fabrication of monolithic integrated circuits. The shaded areas 3 are the locations of the resist material after it has been exposed and developed. The unshaded areas 4 are those of openings or windows in the patterned resist structure defining the locations of the desired isolation regions. FIG. 3A is a cross-sectional view of the indicated portion of the structure of FIG. 2A including the window 4.

When the structure represented by FIGS. 2A and 3A is placed within the solvent vapor chamber of FIG. 1 for a predetermined time and at a predetermined temperature, the window areas are reduced in size as shown in FIGS. 2B and 3B. Inasmuch as the window areas 4 of resist material 3 cover planar surface regions of the underlying layer 2, the reflow movement of the resist material is unimpeded, i.e., the resist material does not encounter physical obstruction as it moves into the window areas. Accordingly, the walls of the resist material 3 which define the perimeter of each window advance uniformly to an extent determined by the predetermined reflow parameter values used, i.e., resist thickness, solvent, temperature and time.

Typically, the temperature within the solvent vapor chamber conveniently may be maintained at 25° C ± 1° C when using an AZ type photoresist material such as type AZ 1350J or type AZ 111 commercially available from the Shipley Corporation. Using a thickness of AZ 1350J type photoresist in the range from 1 micron to 2 microns or a thickness of AZ 111 type photoresist in the range from 7,000 angstroms to 1.5 microns, windows having widths in the range from 2.5 microns to 3 microns may be reduced to a width of about 0.25 micron by exposure to the vapors of acetone for about 5 minutes within the chamber of FIG. 1. Differing amounts of window area reductions can be achieved by varying the type of resist material used, e.g., photo or electron beam resist material, the solvent, time and temperature employed and the thickness of the resist material. Generally, increasing the thickness of the photoresist material increases the amount by which the window area is reduced for a given set of resist reflow process parameter values.

While the invention has been particularly shown and described with reference to the preferred embodiments thereof, it will be understood by those skilled in the art that various changes in form and details may be made therein without departing from the spirit and scope of the invention.

What is claimed is:

1. The method for making patterned resist masks comprising:
    forming on a substrate surface a patterned resist mask having windows exposing planar surface regions of said substrate, and
    flowing said resist mask by exposing said resist mask and substrate to a vapor of a solvent of said resist mask to reduce the area of each of said windows.

2. The method as defined in claim 1 wherein said resist mask is made of a photosensitive material.

3. The method as defined in claim 1 wherein said resist mask is made of an electron beam sensitive material.

4. The method as defined in claim 1 wherein said resist mask is made of a photosensitive material and said solvent is acetone.

5. The method as defined in claim 4 wherein said flowing is carried out in a solvent vapor chamber at room temperature.

6. The method as defined in claim 4 wherein said substrate is formed by providing a semiconductor member and covering said member with an electrical insulating layer.

7. The method as defined in claim 6 wherein said electrical insulating layer is silicon dioxide.

* * * * *